(12) United States Patent
Simon et al.

(10) Patent No.: US 7,233,497 B2
(45) Date of Patent: Jun. 19, 2007

(54) SURFACE MOUNT HEAT SINK

(75) Inventors: Glenn C. Simon, Auburn, CA (US); Derek S. Schumacher, Auburn, CA (US); Brandon A. Rubenstein, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 183 days.

(21) Appl. No.: 10/960,160

(22) Filed: Oct. 6, 2004

(65) Prior Publication Data
US 2006/0072291 A1    Apr. 6, 2006

(51) Int. Cl.
H05K 7/20    (2006.01)
(52) U.S. Cl. .................... 361/720; 361/704; 361/707; 361/719; 257/706; 257/712; 165/80.3
(58) Field of Classification Search ............. None
See application file for complete search history.

(56) References Cited

U.S. PATENT DOCUMENTS

| | | | |
|---|---|---|---|
| 5,050,038 A | 9/1991 | Malaurie et al. | |
| D339,110 S | 9/1993 | Steen, Jr. et al. | |
| 5,258,887 A * | 11/1993 | Fortune | 361/720 |
| 5,311,395 A | 5/1994 | McGaha et al. | |
| 5,390,078 A * | 2/1995 | Taylor | 361/721 |
| 5,615,087 A * | 3/1997 | Wieloch | 361/719 |
| 5,930,114 A | 7/1999 | Kuzmin et al. | |
| 5,933,324 A * | 8/1999 | Barrett | 361/703 |
| 6,097,603 A | 8/2000 | Edwards et al. | |
| 6,178,628 B1 | 1/2001 | Clemens et al. | |
| 6,195,256 B1 * | 2/2001 | Tiziani et al. | 361/704 |
| 6,212,076 B1 * | 4/2001 | MacQuarrie et al. | 361/720 |
| 6,219,238 B1 | 4/2001 | Andros et al. | |
| 6,249,434 B1 | 6/2001 | Scafidi | |
| 6,294,742 B1 | 9/2001 | Ziemkowski | |
| 6,301,114 B1 * | 10/2001 | Ootani | 361/704 |
| 6,335,862 B1 * | 1/2002 | Koya | 361/708 |
| 6,356,447 B2 | 3/2002 | Scafidi | |
| 6,400,573 B1 * | 6/2002 | Mowatt et al. | 361/719 |
| 6,466,454 B1 * | 10/2002 | Jitaru | 361/836 |
| 6,477,054 B1 * | 11/2002 | Hagerup | 361/720 |
| 6,519,156 B2 | 2/2003 | Scafidi | |
| 6,759,278 B2 | 7/2004 | Ashdown | |
| 6,833,993 B2 * | 12/2004 | Wang | 361/704 |
| 6,930,885 B2 * | 8/2005 | Barcley | 361/719 |
| 7,050,304 B2 * | 5/2006 | Hsu et al. | 361/719 |
| 7,054,159 B2 * | 5/2006 | Nakamura | 361/719 |
| 2001/0016981 A1 | 8/2001 | Ziemkowski | |
| 2001/0050429 A1 | 12/2001 | Ashdown | |
| 2003/0227751 A1 * | 12/2003 | Wang | 361/719 |
| 2004/0037044 A1 | 2/2004 | Cook et al. | |
| 2006/0002092 A1 * | 1/2006 | Stevens | 361/719 |

* cited by examiner

Primary Examiner—Boris Chervinsky

(57) ABSTRACT

A heat sink surface mounts to a printed circuit board in direct separation, thermal and physical, from components on the board. The heat sink cools the components by conducting heat from the components through the printed circuit board to the heat sink.

34 Claims, 5 Drawing Sheets

SURFACE MOUNT HEAT SINK

BACKGROUND OF THE INVENTION

Surface mount circuit board technology has led to improvements in electronic component density, lower costs, and manufacturing simplicity.

High power electronic components such as power transistors and power devices commonly benefit from a heat sink that attaches to the component to ensure proper operation. Heat sinks can also improve performance of lower power devices. Heat sinks capable of attaining sufficient cooling are typically a relatively large component on a circuit board. One problem with usage of heat sinks in surface mount technology is the difficulty in fastening a large heat sink to the board using surface mount technology. Another problem is that the higher component density enabled by surface mount technology leaves little available space for placement of heat sinks. A further problem is that the heat sink significantly increases the profile or height of components and devices attached to the board, impeding the configuration of compact designs.

SUMMARY

In accordance with an embodiment of a cooling apparatus, a heat sink surface mounts to a printed circuit board in direct separation, thermal and physical, from components on the board. The heat sink cools the components by conducting heat from the components through the printed circuit board to the heat sink.

BRIEF DESCRIPTION OF THE DRAWINGS

Embodiments of the invention relating to both structure and method of operation, may best be understood by referring to the following description and accompanying drawings whereby.

DETAILED DESCRIPTION

What is desired is a heat sink technology that cools a circuit board in limited available space.

A heat sink and associated method of usage cools components on a board through conduction of heat through multiple conductive planes in the board, functioning as planar internal conductors, to the heat sink on the board surface.

Figure 1B:
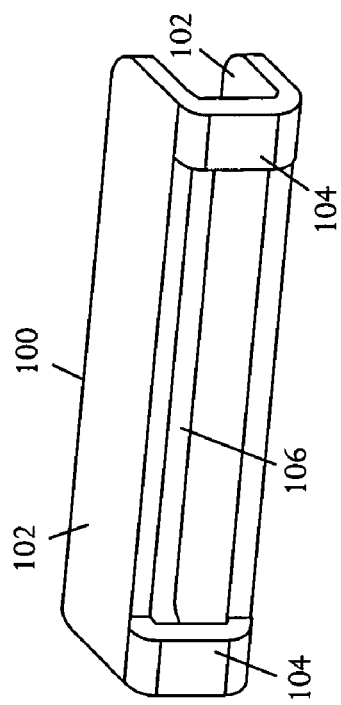
FIGS. 1A and 1B are perspective pictorial diagrams respectively showing top and bottom views of a heat sink embodiment.
Figure 1A:
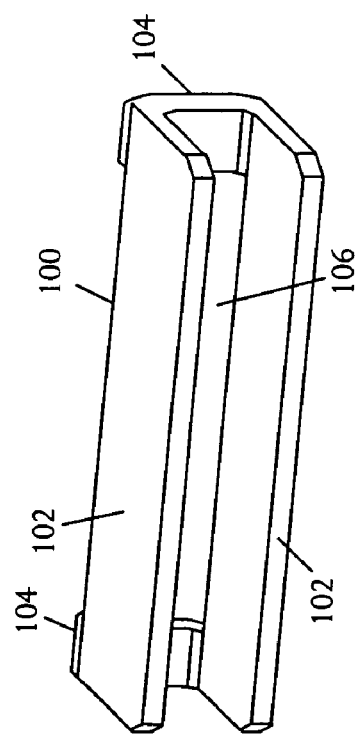

Referring to FIGS. 1A and 1B, perspective pictorial diagrams respectively show top and bottom views of an embodiment of a heat sink 100. The heat sink 100 surface mounts to a printed circuit board in direct separation, thermal and physical, from components on the board. The heat sink 100 cools the components by conducting heat from the components through the printed circuit board to the heat sink 100.

The illustrative heat sink 100 has one or more fins 102 and one or more surface mount pads 104 that can mount to a solder pad on the printed circuit board in direct thermal and physical separation from components on the printed circuit board. The illustrative embodiment has a pair of fins 102 extending substantially perpendicular to the surface mount pad 104 attached to sides of the surface mount pad 104. The fins 102 expand the surface area of the heat sink 100, increasing the amount of air flowing past a circuit, thereby effectively cooling the circuit. Also in the illustrative example, the surface mount pad 104 has a medial aperture 106 forming a space between surface mount pad sections 104 that enables placement of the heat sink 100 straddling typically small components, for example tiny capacitors and resistors, while maintaining direct thermal and physical separation of the heat sink 100 from the straddled components.

Heat from electronic components on the printed circuit board is conducted through metal layers in the printed circuit board to solder pads to which the heat sink 100 is attached. The heat is further conducted through the heat sink 100 and transferred to the air by convection. Accordingly, the heat sink 100 is configured to mount to a printed circuit board surface without making physical or thermal contact to components on the board. For example, the heat sink 100 does not make direct thermal contact with components by direct contact with a component or components.

In configurations useful in many electronic printed circuit board assemblies with limited space, the heat sink 100 may have a form factor that is sufficiently small relative to components mounted on the printed circuit board and to spaces between components so that many heat sinks 100 can be mounted on the printed circuit board.

Figure 2B:
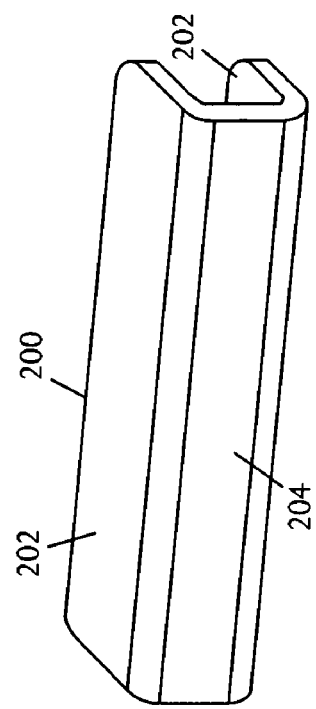
FIGS. 2A and 2B are perspective pictorial diagrams respectively showing top and bottom views of a heat sink embodiment with a surface mount pad extending the full length of the heat sink.
Figure 2A:
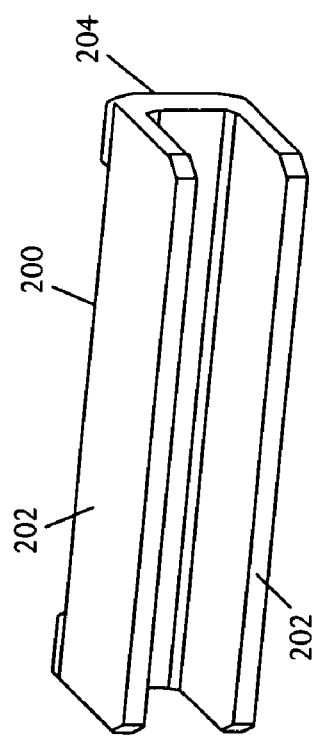

Referring to FIGS. 2A and 2B, perspective pictorial diagrams respectively show top and bottom views of an embodiment of a heat sink 200 having a surface mount pad 204 extending the full length of the heat sink 200. A heat sink embodiment 200 has no medial window in the surface mount pad 204 and thus typically has a better thermal performance in comparison to a heat sink 100 with the window 106 while not allowing the additional space saving enabled by the window 106. The heat sink 200 includes fins 202 to transfer heat to the air.

Figure 3B:
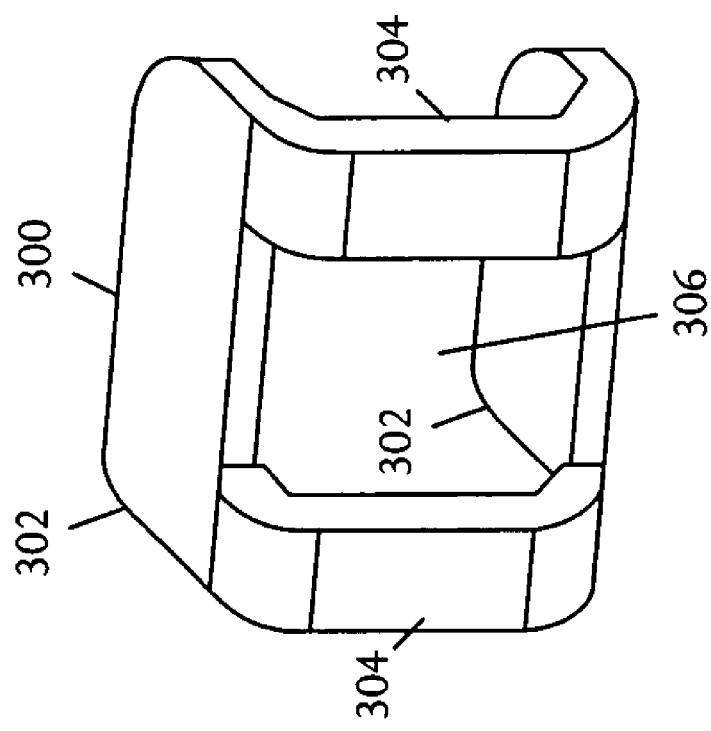
FIGS. 3A and 3B are perspective pictorial diagrams respectively depicting top and bottom views of an embodiment of a heat sink having a relatively square shape.
Figure 3A:
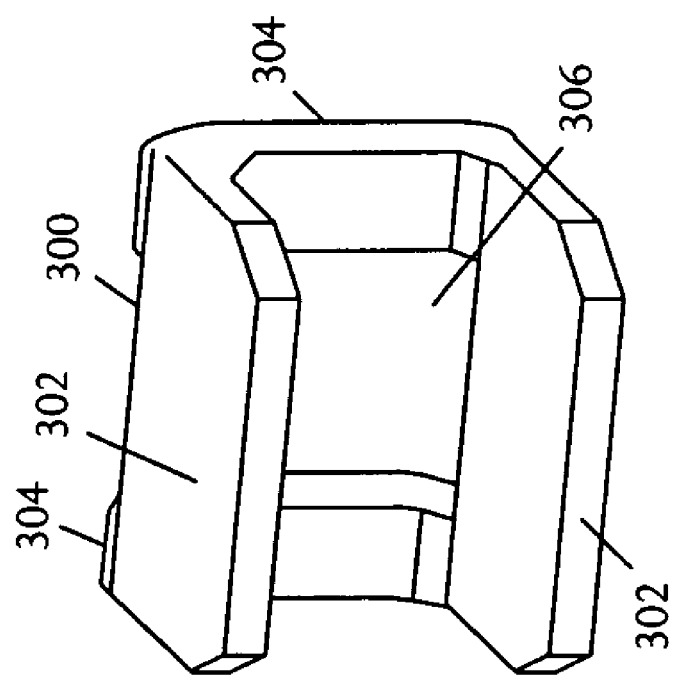

Referring to FIGS. 3A and 3B, perspective pictorial diagrams respectively show top and bottom views of an embodiment of a heat sink 300 having a relatively square shape in comparison to more rectangular heat sinks 100 and 200 shown in FIGS. 1A, 1B and 2A, 2B. The heat sink 300 has fins 302, surface mount pads 304, and a medial window 306 enabling the heat sink 300 to straddle small components such as resistors, capacitors, and the like. Other heat sink embodiments may have other shapes and sizes with varying lengths, widths, and heights, and any suitable number of surface mount pads 104, 204, 304 from a single pad to multiple pads. For example, heat sinks may have rounded shapes, squared or rectangular shapes, symmetric shapes, asymmetric shapes, and other shapes. Some suitable heat sinks may extend for relatively long distances in a line that extends between closely-spaced large components such as processors, memories, power supplies, connectors, and the like. Suitable heat sinks may have multiple segments that branch from one another at various selected angles.

The various heat sink embodiments 100, 200, 300 surface mount to a printed circuit board and may have a form factor sufficiently small relative to components mounted on the printed circuit board and spaces between components whereby many heat sinks 100, 200, 300 can be mounted on the printed circuit board in direct separation, thermal and physical, from the components on the board.

In some embodiments, the heat sinks 100, 200, or 300 may have a form factor that is uniform among heat sinks so that the heat sinks are distributed on the printed circuit board in spaces between components using automated pick and place equipment.

The heat sinks 100, 200, 300 may be constructed in a simple geometry and configuration, enabling very inexpensive manufacture, for example less than one cent per unit. The heat sinks 100, 200, 300 can be added to a circuit board at any location that space is available on the board. Heat sinks 100, 200, 300 compliant with standard sizing can be added by a board layout engineer in the manner of any other component. For example, the heat sinks 100, 200, 300 may be automatically placed on a circuit board using pick and place equipment that is commonly used for placement of components and devices. The heat sinks 100, 200, 300 can have a small mass, enabling mounting of the heat sinks 100, 200, 300 on either top or bottom surfaces of a printed circuit board. The small size further enables the heat sinks 100, 200, 300 to have a low thermal mass, thereby facilitating reflow so that the board need not be heated extensively during the solder reflow process of the heat sinks 100, 200, 300.

The heat sinks 100, 200, 300 can be any suitable size. A particular example may be configured in a rectangular shape of approximately ½"×⅛"×⅛", although any other size may otherwise be used.

Heat sinks 100, 300 with a window 106, 306 in the surface mount pad 104, 304 can be designed to enable straddling of small components such as tiny capacitors and resistors, thus conserving board space.

The heat sinks 100, 200, 300 are commonly constructed from metal or alloy materials, for example materials that can be formed into thin structures such as aluminum, copper, and the like, so that the heat sinks 100, 200, 300 can be light weight and maintain a sufficiently rigid structure due to the small unit size. The small size and material properties of the heat sinks 100, 200, 300 form small and rigid devices that are durable and unlikely to bend.

The heat sink 100, 200, 300 cools components by conducting heat from the components through the printed circuit board to the heat sink 100, 200, 300.

Figure 4:
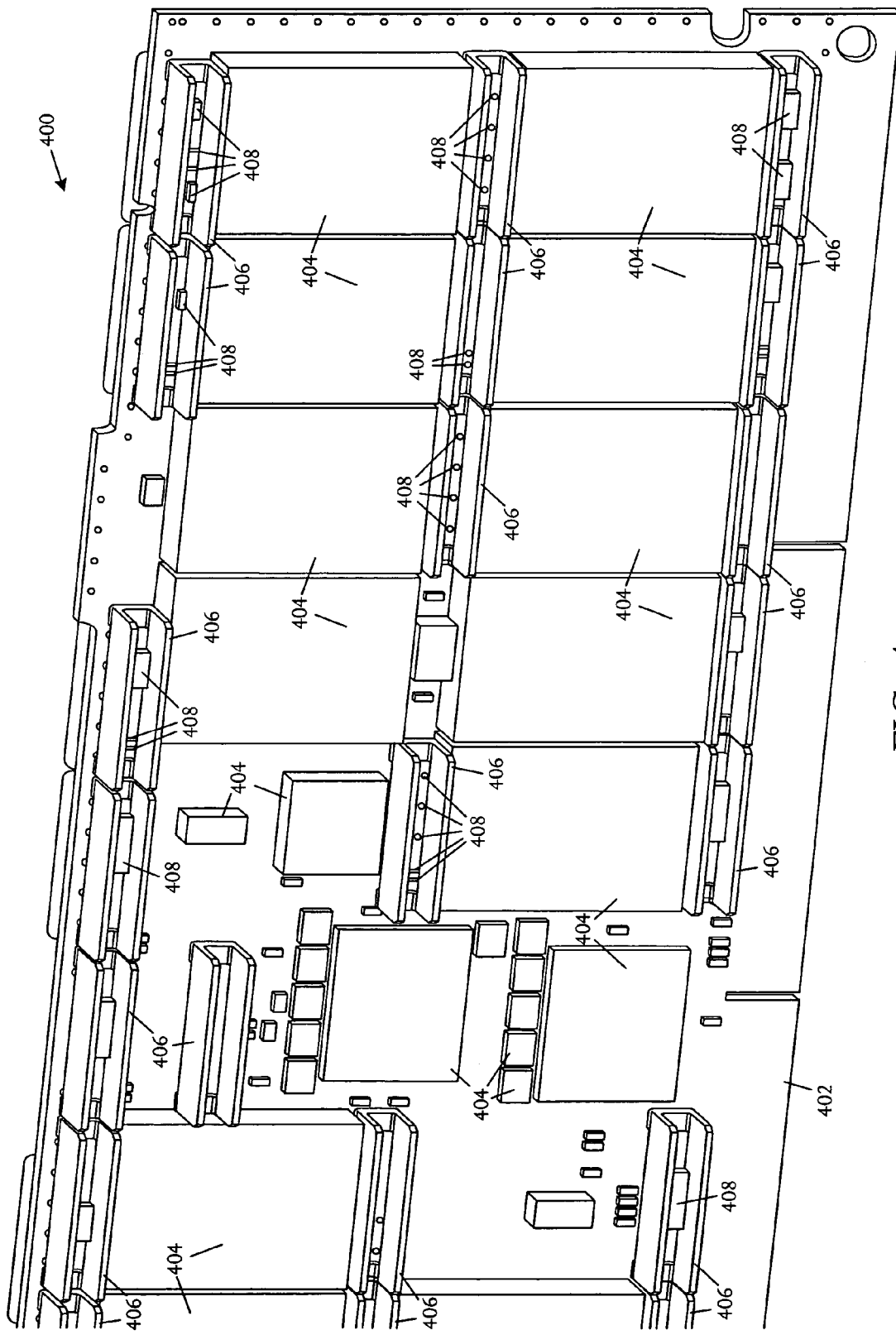
FIG. 4 is a perspective pictorial diagram illustrating an embodiment of an apparatus that can be cooled using one or more of the illustrative heat sinks.

Referring to FIG. 4, a perspective pictorial diagram illustrates an embodiment of an apparatus 400 that can be cooled using one or more of the illustrative heat sinks. The apparatus 400 can be an electronic circuit including a printed circuit board 402 in a laminar structure including multiple conductive layers and multiple isolating layers. A plurality of components 404 are mounted on the printed circuit board. One or more heat sinks 406 are mounted on the printed circuit board in direct separation, thermal and physical, from the components 404. The heat sinks 406 cool the components 404 by conducting heat from the components 404 through the printed circuit board 402 to the heat sinks 406.

The components 404 and heat sinks 406 are surface mounted to the printed circuit board 402 using conventional surface mount fabrication techniques.

In some embodiments, the heat sinks 406 surface mount to the printed circuit board 402 and have a form factor sufficiently small relative to the components 404 and spaces between components 404 so that multiple heat sinks 406 can be mounted on the printed circuit board 402 in direct separation, thermal and physical, from the components 404. For example, in the illustrative embodiment, the heat sinks 406 are arranged with surface mount pads flush to the board surface and fin surfaces protruding from the board, exposed to air. The illustrative heat sinks 406 have a very low profile, extending approximately the height of the components 404. In one example, the heat sinks 406 extend about ⅒" to ⅛" above the board surface.

In a typical example, all heat sinks 406 can have the same small size with a uniform form factor and surface area. The small size enables the heat sinks 406 to be placed virtually anywhere and everywhere space is available on the board between and around the various components 404, 408.

In some embodiments, for example the heat sinks 100, 300 shown in FIGS. 1A, 1B, 3A, 3B, the surface mount pad has the medial aperture 106, 306 forming a space between surface mount pad sections 104, 304. The medial apertures enable placement of heat sinks 406 straddling various small components 408, for example capacitors, resistors, and the like, while maintaining direct thermal and physical separation of the heat sinks 406 from the straddled components 408.

Heat from electronic components 404, 408 on the printed circuit board 402 is conducted through metal layers in the printed circuit board to solder pads to which the heat sinks 406 are attached and through the heat sinks 406 with the heat transferred to air by convection.

A method for cooling the circuit board 402 is practiced by supplying a suitable printed circuit board 402 with a laminar structure that includes multiple conductive layers and multiple isolating layers. Suitable locations for multiple components 404, 408 are arranged or laid out for mounting on the printed circuit board 402. Similarly, suitable locations for a large number of heat sinks 406 can also be arranged or laid out for mounting on the printed circuit board 402 in spaces between the components 404, 408. The heat sinks 406 are positioned physically and thermally separated from the components 404, 408 so that the components 404, 408 are cooling by conducting heat through the printed circuit board 402 to the heat sinks 406.

The illustrative embodiment depicts a cooling apparatus 400 for a circuit board 402 configured as a Dual In-line Memory Module (DIMM). Many electronic printed circuit board assemblies have very little space for heat sinks that extend above the height of the components. A memory DIMM is a typical example of such condition. Memory DIMMs are typically closely spaced and have only a fraction of an inch of space between upper surfaces of integrated circuit chip packages on adjacent DIMMs. The illustrative heat sinks 406 can be applied at numerous locations across the board 402, effectively removing heat from the board 402.

Figure 5:
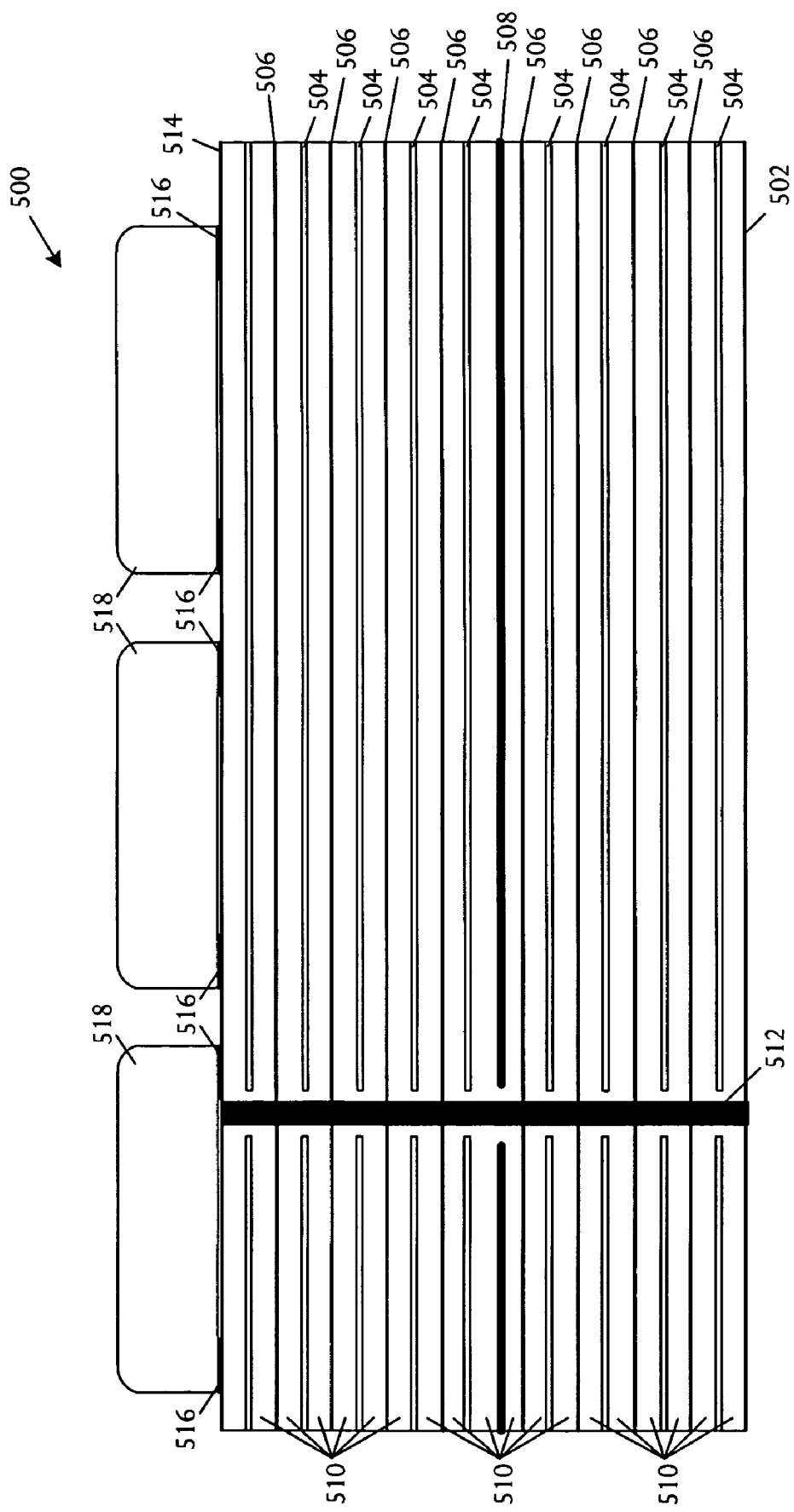
FIG. 5 is a conceptual cross-sectional view showing an embodiment of a substrate in a printed circuit board.

Referring to FIG. 5, a conceptual cross-sectional view shows an embodiment of a substrate 502 in a printed circuit board 500. Structures shown in FIG. 5 are highly conceptual and are not necessarily shown in actual scale. The substrate 502 has a plurality of substrate layers in the printed circuit board 500 including signal track layers 504, at least one ground plane 506, at least one power plane 508, and a plurality of isolation layers 510. The substrate 502 further illustrates a via 512 or possibly multiple vias extending through the multiple substrate layers that conduct heat to the printed circuit board surface 514. Solder pads 516 are coupled to the printed circuit board surface 514 at selected pattern locations and are conductively coupled to the via 512. Heat sinks 518 are selectively mounted to the solder pads 516. The heat sinks 518 cool components on the board 500 by conducting heat from the components through the printed circuit board 500 to the heat sinks 518.

In a particular embodiment, the heat sinks 518 each have two plated solder pads 516 that are mounted flat on the printed circuit board surface 514 at selected pattern locations and conductively coupled to internal ground planes 506 through the via 512. Typically the power 508 and ground 510 planes extend completely across the length and width of the board 550 so that thermal conduction flows throughout the entire board 500 and enables the heat sinks 518 to be placed at any location on the board 500. Connecting the pads 516 to which the heat sinks 518 are soldered to ground planes 506 through vias 512 creates a low-resistance pathway to conductive metal planes, for example solid copper planes, in the board 500, ensuring good conduction paths to the heat sinks 518. Mutual connection of all heat sinks 518 to ground potential can improve electromagnetic interference (EMI) performance and, in come configurations and circumstances, electrostatic discharge (ESD) performance.

The method for cooling the circuit board can further include the action of supplying the printed circuit board 500 which includes a plurality of substrate layers such as signal track layers 504, at least one ground plane 506, at least one power plane 508, and multiple isolation layers 510. Vias 512 can be excavated and filled with conductive material, such as metal, extending through multiple layers of the substrate. Thermal vias 512 conduct heat through the multiple layers to the printed circuit board surface 514 and to the heat sinks 518.

The method further comprises selecting or laying out the arrangement or configuration of the solder pads 516 on the printed circuit board surface 514 at selected pattern locations. The solder pads 516 are conductively coupled to the vias 512 and the heat sinks 518 are mounted to the solder pads 516 by soldering. In a particular embodiment, the method comprises configuring the vias 512 to conductively contact one or more ground planes 506 to enable grounding of the heat sinks 518.

The heat sinks 518 can have a small form factor and are surface mounted on pads 516 on the printed circuit assembly board 500 using a reflow solder process. Surface tension forces on the solder typically generate surface tension forces of the solder, facilitating self-placement of the heat sink surface mount pads on circuit board solder pads and assisting self-centering of the heat sinks 518. The small size enables a large number of heat sinks 518 to be installed in numerous locations on the board 500 in available spaces between components, generally throughout both sides of the board 500. The small size further enables the heat sinks 518 to fit in small spaces between components.

In some embodiments, the cooling method can further include using heat sinks 518 of a uniform or standard size, enabling mounting of the many components and heat sinks 518 using automatic pick and place equipment that facilitates placement of the small form factor heat sinks 518 in any position space is available on a potentially crowded board.

The heat sinks 518 remove heat from the board 500 by increasing the surface area exposed to the air. Heat from the electronic components on the board 500 is conducted through metal layers in the board 500 to the solder pads 516 and the heat sinks 518 attached to the pads 516. The heat is then conducted through the heat sinks 518 and transferred to the air by convection.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. For example, although particular heat sinks of particular sizes and shapes are described, any suitable size and shape may be used. Furthermore, although the cooling structures and methods are depicted in a particular application and on a particular type of circuit board, any suitable application or type of circuit may be implemented.

What is claimed is:

1. A heat sink that surface mounts to a printed circuit board separated from direct thermal and physical contact with any component of multiple components on the board and has a profile with a largest lateral dimension that is substantially smaller than a largest lateral dimension of at least one component on the board, a smallest lateral dimension sufficiently small to enable positioning between closely-spaced large components of the multiple components, and a height dimension that protrudes from the printed circuit board no further than approximately to height of the components, the heat sink cooling the components by conducting beat from the components through the printed circuit board to the heat sink.

2. The heat sink according to claim 1 further comprising:
at least one fin that, for the heat sink surface mounted on the printed circuit board, protrudes from the printed circuit board no further than approximately to height of the components; and
at least one surface mount pad that mounts to a solder pad on the printed circuit board separated from direct thermal and physical contact with components on the printed circuit board.

3. The heat sink according to claim 1 further comprising:
a substantially rectangular surface mount pad; and
a pair of fins extending substantially perpendicular to the surface mount pad attached to sides of the surface mount pad and protruding from the printed circuit board no further than approximately to height of the components.

4. The heat sink according to claim 3 wherein:
the surface mount pad fhrther comprises a medial aperture that forms a space between surface mount pad sections and configured for placement of the heat sink swaddling resistor and/or capacitor components while maintaining direct thermal and physical separation of the heat sink from the straddled components.

5. The heat sink according to claim 1 wherein:
the heat sink is configured for general distribution on the printed circuit board independently from association with a particular electronic component; and
heat from electronic components on the printed circuit board is conducted trough metal layers in the printed circuit board to solder pads to which the heat sink is attached and through the heat sink, the heat being transferred to air by convection.

6. The heat sink according to claim 1 wherein:
the heat sink has a form factor with at least one lateral dimension that is sufficiently small relative to components mounted on the printed circuit board and spaces between components that multiple heat sinks can be mounted on the printed circuit board in a line that extends between closely-spaced large components selected from processors, memories, power supplies, and connectors; and the heat sink has a relatively low thermal mass whereby heating during solder reflow attachment of the heat sink to the printed circuit board is limited.

7. A heat sink that surfhce mounts to a printed circuit board and has a form factor with at least one lateral dimension that is sufficiently small relative to electronic components mounted on the printed circuit board and spaces between components that multiple heat sinks can he mounted on the printed circuit board in a line that extends between closely-spaced large components selected from processors, memories, power supplies, and connectors, and separated from direct thermal and physical contact with the electronic components on the board and has a profile that protrudes from the printed circuit board no further than approximately to height of the electronic components.

8. The heat sink according to claim 7 wherein:
the beat sink has a form factor that is uniform among heat sinks whereby the heat sinks are distributed on the printed circuit board in spaces between electronic components using automated pick and place equipment; and
the heat sink has a relatively low thennal mass whereby heating during solder reflow attachment of the heat sink to the printed circuit board is limited.

9. The heat sink according to claim 7 wherein:
the heat sink is generally distributed on the printed circuit board independently from association with a particular electronic component and cools the electronic components by conducting heat from the electronic components through the printed circuit board to the heat sink.

10. The heat sink according to claim 7 further comprising:
at least one fin constructed from a metal or alloy that for the heat sink surface mounted on the printed circuit board, protrudes from the printed circuit board no further than approximately to height of the components; and
at least one surface mount pad constructed from a metal or alloy that mounts to a solder pad on the printed circuit board separated from direct thermal and physical contact with components on the printed circuit board.

11. The heat sink according to claim 7 fUrther comprising:
a substantially rectangular surface mount pad constructed from a metal or alloy; and
a pair of fins constructed from a metal or alloy extending substantially perpendicular to the surface mount pad attached to sides of the surface mount pad and protruding from the printed circuit board no further than approximately to height of the components.

12. The heat sink according to claim 11 wherein:
the surface mount pad further comprises a medial aperture that forms a space between surface mount pad sections and configured for piacement of the heat sink straddling resistor and/or capacitor components while maintaining direct thermal and physical separation of the heat sink from the straddled components.

13. The heat sink according to claim 7 wherein:
the heat sink is configured for general distribution on the printed circuit board independently from association with a particular electronic component; and
heat from electronic components on the printed circuit board is conducted through metal layers in the printed circuit board to solder pads to which the heat sink is attached and through the heat sink, the heat being transfened to air by convection.

14. An apparatus comprising:
a printed circuit board in a laminar sirncture including multiple conductive layers and multiple isolating layers;
a plurality of electronic components mounted on the printed circuit board; and
a plurality of heat sinks mounted on the printed circuit board separated from direct thermal and physical; contact with any component of the plurality of electronic components on the board, the heat sink plurality each having a profile with a largest lateral dimension that is substantially smaller than a largest lateral dimension of at least one component on the board, a smallest lateral dimension sufficiently small to enable positioning between closely-spaced large components of the component plurality, the heat sink plurality generally distributed on the printed circuit board independently from association with particular electronic components and cooling the components by conducting heat from the components through the printed circuit board to the at least one heat sink.

15. The apparatus according to claim 14 farther comprising:
a plurality of substrate layers in tbe printed circuit board including signal track layers, at least one ground plane, at least one power plane, and a plurality of isolation layers; and
at least one via extending through multiple layers of the substrate that conduct heat through the multiple layers to the printed circuit board surface in general distribution on the printed circuit board independently from association with particular electronic components.

16. The apparatus according to claim 15 farther comprising:
solder pads coupled to the printed circuit board surface at selected pattern locations and conductively coupled to the at least one via, the heat sinks being selectively mourned to the solder pads.

17. The apparatus according to claim 15 farther comprising:
solder pads coupled to the printed circuit board surface at selected pattern locations and conductively coupled to the at least one ground plane by the at least one via, the heat sinks being selectively mounted to the solder pads.

18. The apparatus according to claim 14 wherein a heat sink of the heat sink plurality further comprises:
at least one fin that, for te heat sink surface mounted on the printed circuit board, protrudes from the printcd circuit board no further than approximately to height of the components; and
at least one surface mount pad that mounts to a solder pad on the printed circuit board separated from direct thermal and physical contact with components on the printed circuit board.

19. The apparatus according to claim 18 wherein a heat sink of the heat sink plurality further comprises:
a surface mount pad with a medial aperture forming a space between surface mount pad sections and configured for placement of a heat sink of the heat sink plurality straddling resistor and/or capacitor components while maintaining direct thermal and physical separation of the heat sink from the straddled components.

20. The apparatus according to claim 14 wherein:
heat from electronic components on the printed circuit board is conducted trough metal layers in the printed circuit board to solder pads to which the heat sink plurality is attached and through the at least one heat sink, the heat being transferred to air via convection.

21. The apparatus according to claim 14 wherein:
the heat sink plurality have a form factor with at least one lateral dimension that is sufficiently small relative to components mounted on the printed circuit board and spaces between components that multiple heat sinks can be mounted on the printed circuit board in a line that extends between closely-spaced large components selected from processors, memories, power supplies, and connectors; and
the heat sink plurality hae have a relatively low thermal mass whereby heating during solder reflow attachment of the heat sink plurality to the printed circuit board is limited.

22. An apparatus comprising:
a printed circuit board in a laminar structure including multiple conductive layers and multiple isolating layers;
a plurality of electronic components mounted on the printed circuit board; and
a plurality of heat sinks that surface mount to a printed circuit board and have a form factor sufficiently small relative to the electronic components mounted on the printed circuit board and spaces between components that multiple heat sinks can be mounted on the printed circuit board separated from direct thermal and physical contact with the electronic components on the board and have a profile with a largest lateral dimension that is substantially smaller than a largest lateral dimension of at least one component, a smallest lateral dimension sufficiently small to enable positioning between closely-spaced large components of the multiple components, and a height dimension that protrudes from the printed circuit board no further than approximately to height of the electronic components.

23. The apparatus according to claim 22 further comprising:
a plurality of substrate layers in the printed circuit board including signal track layers, at least one ground plane, at least one power plane, and a plurality of isolation layers; and
at least one via extending trough multiple layers of the substrate that conduct heat trough the multiple layers to the printed circuit board surface in general distribution an the printed circuit board independently from association with particular electronic components.

24. The apparatus according to claim 23 further comprising:
solder pads coupled to the printed circuit board surface at selected pattern locations and conductively coupled to the at least one via, the heat sinks being selectively mounted to the solder pads.

25. The apparatus according to claim 23 further comprising:
solder pads coupled to the printed circuit board surface at selected pattern locations and conductively coupled to the at least one ground plane by the at least one via, the heat sinks being selectively mounted to the solder pads.

26. The apparatus according to claim 22 wherein:
the heat sink plurality have a form factor that is uniform among heat sinks whereby the heat sinks are distributed on the printed circuit board in spaces between components using automated pick and place equipment and
the heat sink plurality have a relatively low thermal mass whereby heating during solder reflow attachment of the heat sink to the printed circuit board is limited.

27. The apparatus according to claim 22 wherein:
the heat sink pluraliy are generally distributed on the printed circuit board independently from association with a particular electronic component and cool the electronic components by conducting heat from the electronic components through the printed circuit board to the heat sink plurality.

28. The apparams according to claim 22 wherein the heat sink plurality further comprise:
at least one fin constructed from a metal or alloy that, for the heat sink surface mounted on the printed circuit board, protrudes from the printed circuit board no further than approximately to height of the electronic components; and
at least one surface mount pad constructed from a metal or alloy that mounts to a solder pad on the printed circuit board separated from direct thermal and physical contact with the electronic components on the printed circuit board.

29. The apparatus according to claim 22 wherein the heat sink plurality further comprise:
a substantially rectangular surface mount pad constructed from a metal or alloy; and
a pair of fins constructed from a metal or alloy extending substantially perpendicular to the surface mount pad attached to sides of the surface mount pad and protruding from the printed circuit board no further than approximately to height of the components.

30. A method for cooling a circuit board comprising:
providing a printed circuit board with a laminar structure including multiple conductive layers and multiple isolating layers;
configuring a plurality of components for mounting on the printed circuit board;
configuring a plurality of heat sinks for mounting on the printed circuit board in spaces between the plurality of components separated from direct thermal and physical contact with the electronic components, the individual heat sinks having a profile with a largest lateral dimension that is substantially smaller than a largest lateral dimension of at least one component on the board and a smallest lateral dimension sufficiently small to enable positioning between closely-spaced large components of the multiple components;
distributing the heat sink plurality generally across the printed circuit board independently from association with particular electronic components; and
cooling the components by conducting heat from the components trough the printed circuit board to the plurality of heat sinks.

31. The method according to claim 30 further comprising:
providing the printed circuit board including a plurality of substrate layers in the printed circuit board including signal track layers, at least one ground plane, at least one power plane, a plurality of isolation layers, and at least one via extending trough multiple layers of the substrate that conduct heat through the multiple layers to the printed circuit board surface in general distribution on the printed circuit board independently from association with particular electronic components.

32. The method according to claim 31 further comprising:
configuring solder pads on the printed circuit board surface at selected pattern locations conductively coupled to the at least one via;
configuring the heat sinks of the heat sink plurality with a profile that protrudes from the printed circuit board no further than approximately to height of the electronic components; and
selectively mounting the plurality of beat sinks to the solder pads.

33. The method according to claim 31 further comprising:
configuring solder pads on the printed circuit board surface at selected pattern locations conductively coupled to the at least one ground plane by the at least one via;
configuring the heat sinks of the heat sink plurality with a profile that protrudes from the printed circuit board no further than approximately to height of the electronic components; and
selectively mounting the plurality of heat sinks to the solder pads.

34. The method according to claim 30 further comprising:
configuring the heat sinks of the heat sink plurality with a profile that protrudes from the printed circuit board no further than approximately to height of the electronic components; and mounting the plurality of components and plurality of heat sinks using automated pick and place equipment.

* * * * *

UNITED STATES PATENT AND TRADEMARK OFFICE
CERTIFICATE OF CORRECTION

PATENT NO. : 7,233,497 B2
APPLICATION NO. : 10/960160
DATED : June 19, 2007
INVENTOR(S) : Glenn C. Simon et al.

It is certified that error appears in the above-identified patent and that said Letters Patent is hereby corrected as shown below:

In column 6, line 28, in Claim 1, delete "beat" and insert -- heat --, therefor.

In column 6, line 47, in Claim 4, delete "fhrther" and insert -- further --, therefor.

In column 6, lines 49-50, in Claim 4, delete "swaddling" and insert -- straddling --, therefor.

In column 6, line 58, in Claim 5, delete "trough" and insert -- through --, therefor.

In column 7, line 7, in Claim 7, delete "surfhce" and insert -- surface --, therefor.

In column 7, line 11, in Claim 7, delete "he" and insert -- be --, therefor.

In column 7, line 20, in Claim 8, delete "beat" and insert -- heat --, therefor.

In column 7, line 25, in Claim 8, delete "thennal" and insert -- thermal --, therefor.

In column 7, line 35, in Claim 10, after "that" insert -- , --.

In column 7, line 45, in Claim 11, delete "fUrther" and insert -- further --, therefor.

In column 7, line 57, in Claim 12, delete "piacement" and insert -- placement --, therefor.

In column 8, line 2, in Claim 13, delete "transfened" and insert -- transferred --, therefor.

In column 8, line 4, in Claim 14, delete "siructure" and insert -- structure --, therefor.

In column 8, line 11, in Claim 14, after "physical" delete ";".

In column 8, line 25, in Claim 15, delete "farther" and insert -- further --, therefor.

UNITED STATES PATENT AND TRADEMARK OFFICE
CERTIFICATE OF CORRECTION

PATENT NO.          : 7,233,497 B2
APPLICATION NO.  : 10/960160
DATED                  : June 19, 2007
INVENTOR(S)         : Glenn C. Simon et al.

It is certified that error appears in the above-identified patent and that said Letters Patent is hereby corrected as shown below:

In column 8, line 27, in Claim 15, delete "tbe" and insert -- the --, therefor.

In column 8, line 36, in Claim 16, delete "farther" and insert -- further --, therefor.

In column 8, line 41, in Claim 16, delete "mourned" and insert -- mounted --, therefor.

In column 8, line 42, in Claim 17, delete "farther" and insert -- further --, therefor.

In column 8, line 51, in Claim 18, delete "te" and insert -- the --, therefor.

In column 8, line 52, in Claim 18, delete "printcd" and insert -- printed --, therefor.

In column 9, line 3, in Claim 20, delete "trough" and insert -- through --, therefor.

In column 9, line 16, in Claim 21, after "plurality" delete "hae".

In column 9, line 48, in Claim 23, delete "trough" and insert -- through --, therefor.

In column 9, line 49, in Claim 23, delete "trough" and insert -- through --, therefor.

In column 9, line 51, in Claim 23, delete "an" and insert -- on --, therefor.

In column 10, line 2, in Claim 26, after "equipment" insert -- ; --.

In column 10, line 7, in Claim 27, delete "pluraliy" and insert -- plurality --, therefor.

In column 10, line 13, in Claim 28, delete "apparams" and insert -- apparatus --, therefor.

UNITED STATES PATENT AND TRADEMARK OFFICE
CERTIFICATE OF CORRECTION

| | |
|---|---|
| PATENT NO. | : 7,233,497 B2 |
| APPLICATION NO. | : 10/960160 |
| DATED | : June 19, 2007 |
| INVENTOR(S) | : Glenn C. Simon et al. |

It is certified that error appears in the above-identified patent and that said Letters Patent is hereby corrected as shown below:

In column 10, line 56, in Claim 30, delete "trough" and insert -- through --, therefor.

In column 10, line 63, in Claim 31, delete "trough" and insert -- through --, therefor.

In column 11, line 9, in Claim 32, delete "beat" and insert -- heat --, therefor.

Signed and Sealed this

Ninth Day of September, 2008

JON W. DUDAS
*Director of the United States Patent and Trademark Office*